United States Patent [19]

Kawashima

[11] Patent Number: 5,469,010
[45] Date of Patent: Nov. 21, 1995

[54] METHOD OF ADJUSTING FREQUENCY OF NS-GT CUT QUARTZ RESONATOR

[75] Inventor: Hirofumi Kawashima, Sendai, Japan

[73] Assignee: Seiko Electronic Components Ltd., Japan

[21] Appl. No.: 205,946

[22] Filed: Mar. 3, 1994

[51] Int. Cl.[6] .................................................. H01L 41/08
[52] U.S. Cl. .......................................... 310/312; 310/361
[58] Field of Search ...................................... 310/312, 361

[56] References Cited

U.S. PATENT DOCUMENTS

| | | | |
|---|---|---|---|
| 4,050,126 | 9/1977 | Ikeno et al. | 310/361 |
| 4,443,728 | 4/1984 | Kudo | 310/312 |
| 4,447,753 | 5/1984 | Ochiai | 310/312 |
| 4,484,382 | 11/1984 | Kawashima | 310/312 |

FOREIGN PATENT DOCUMENTS

| | | | |
|---|---|---|---|
| 0147818 | 11/1980 | Japan | 310/312 |
| 0091017 | 6/1982 | Japan | 310/361 |
| 0170109 | 10/1983 | Japan | 310/312 |
| 0044113 | 3/1984 | Japan | 310/312 |
| 0036408 | 12/1994 | Japan | 310/312 |

OTHER PUBLICATIONS

Proc. 36th Annual Frequency Control Symposium, Jun. 2–4, 1982, Philadelphia, Pa., pp. 90–96 O. Ochiai et al., "Method of Adjusting Resonant Frequency and Frequency–Temperature Coefficients of Miniaturized GT Cut Quartz Resonators".

*Primary Examiner*—Thomas M. Dougherty
*Attorney, Agent, or Firm*—Adams & Wilks

[57] ABSTRACT

A method of adjusting a frequency-to-temperature coefficient of an NS-GT cut quartz resonator comprises providing a coupling resonator having a first order temperature coefficient $\alpha_+$. A normalized frequency $\delta$ of the coupled vibrational modes is then calculated according to the relationship $\alpha_+ = m\delta + n$, where m and n are constants. The normalized frequency $\delta$ is then adjusted according to the relationship $\alpha_+ = m\delta + n$ to set the first order temperature coefficient to substantially zero.

2 Claims, 8 Drawing Sheets

F I G. 6
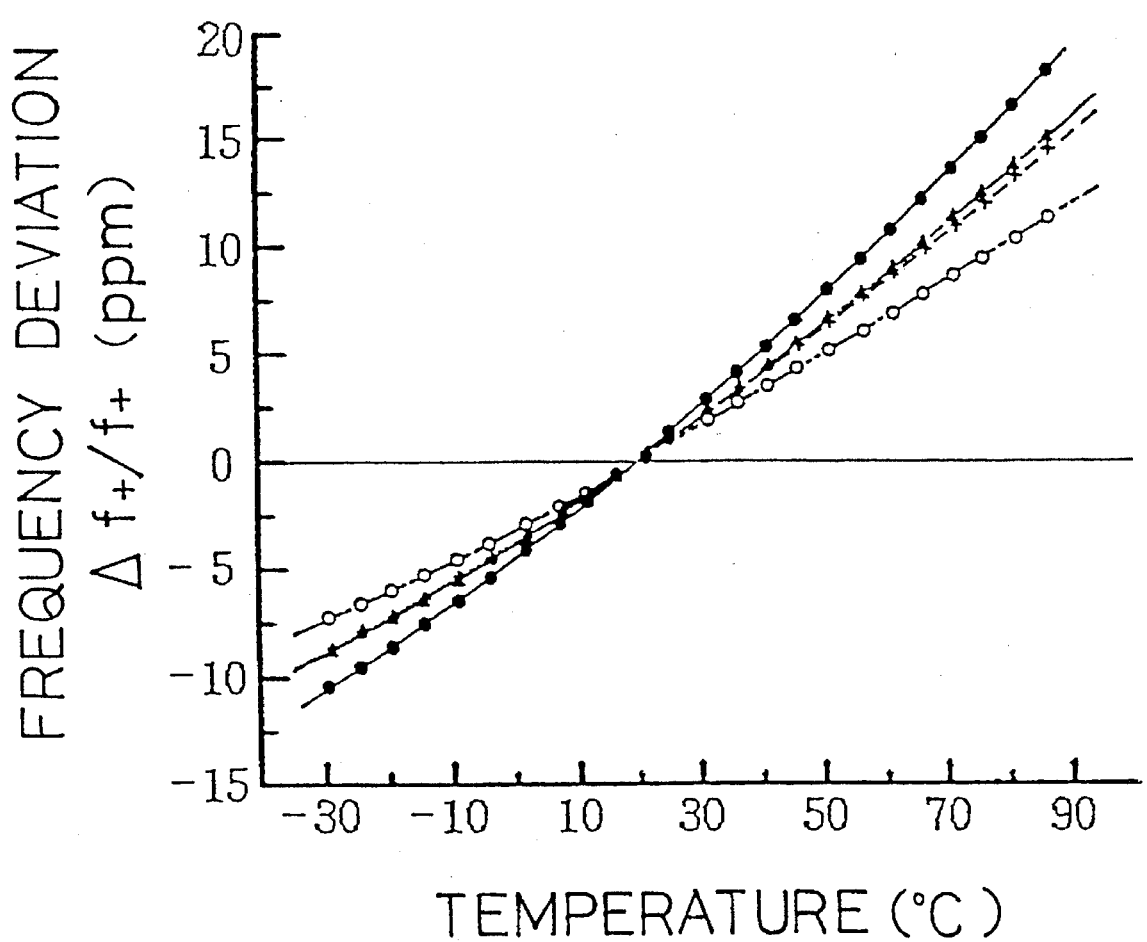

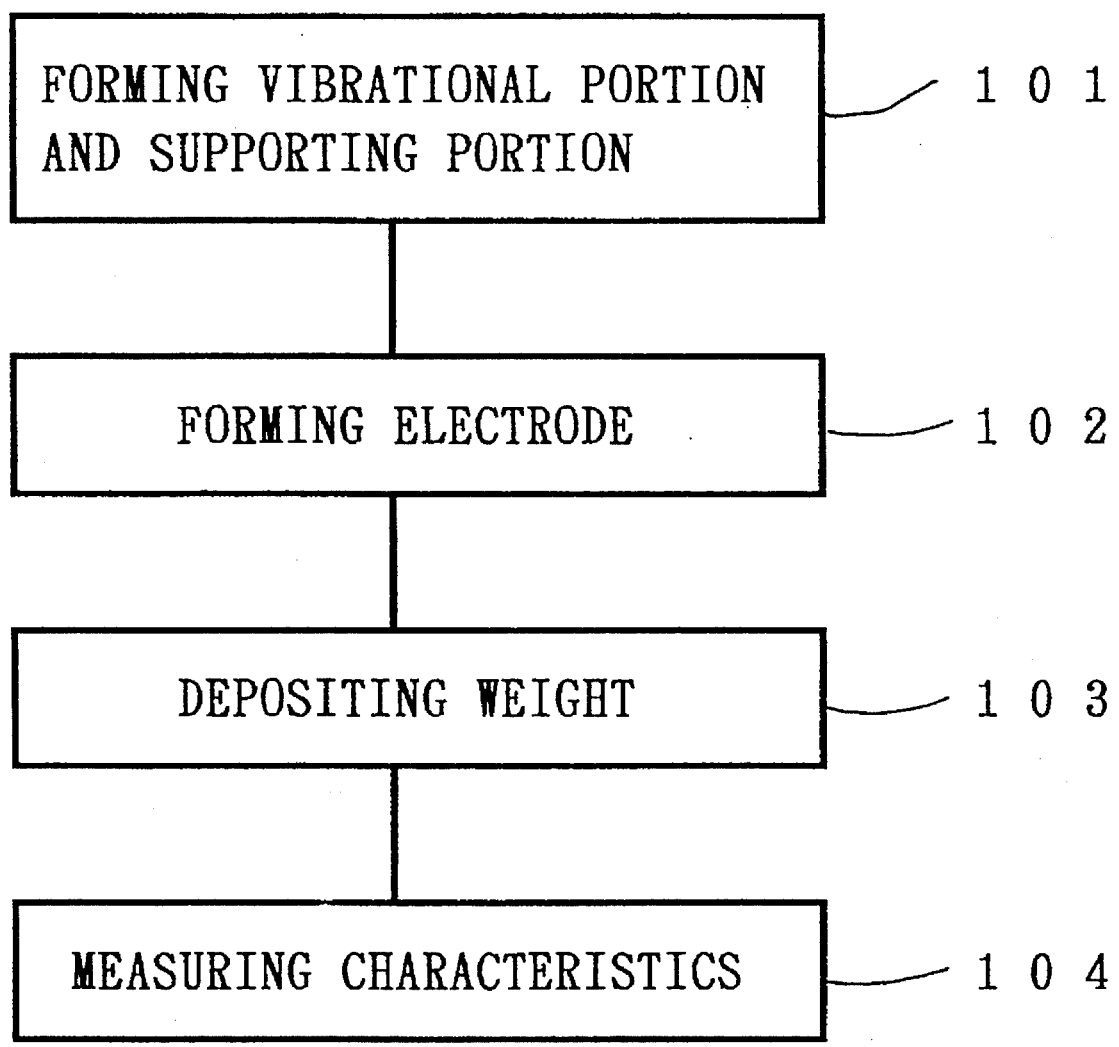

METHOD OF ADJUSTING FREQUENCY OF NS-GT CUT QUARTZ RESONATOR

BACKGROUND OF THE INVENTION

Field of the Invention

The present invention relates to a coupling quartz resonator, particularly, of a GT cut quartz resonator consisting of a vibrational portion and two supporting portions (hereinafter referred to as "NS-GT cut resonator") and a method of adjusting the frequency of a NS-GT cut resonator. In particular, the invention relates to the adjustment method for obtaining a GT cut quartz resonator that has remarkably excellent frequency-to-temperature characteristics (hereinafter simply referred to as "temperature characteristics").

PRIOR ART

Recently, a method of forming a resonator by photolithography practically using IC technology has been applied to resonator manufacture, thereby resulting in production of a resonator which is remarkably downsized. For example, such a method has been applied to a NS-GT cut resonator and has been capable of making its thickness considerably thin and achieving excellent temperature characteristics, enabling the resonator to be remarkably downsized. However, in order to obtain good temperature characteristics, two vibrational modes, that is, the coupling of a primary vibration and a subvibration, are utilized for the NS-GT cut resonator. Consequently, the temperature characteristics are determined by a difference in a resonant frequency between the primary vibration and the subvibration and by the intensity of the respective vibrations. In particular, if the ratio in the vibration intensity between the primary vibration and subvibration is different for different resonators, the difference in the resonant frequency therebetween which provides good temperature characteristics is also different, thereby requiring an adjustment of the difference in the resonant frequency for each of the resonators. However, it takes a long time to adjust the resonant frequency, which is a factor in increase of cost, and this system is unsuitable in mass production, which is one of the causes that the resonators of this type are not used in more fields of application.

As described above, there has remained such a problem that the NS-GT cut resonator with remarkably excellent temperature characteristics cannot be obtained in a short time and also with ease, and therefore, an inexpensive resonator cannot be obtained.

SUMMARY OF THE INVENTION

The present invention solves the foregoing problems by providing a method of adjusting the frequency-to-temperature coefficient of an NS-GT cut quartz resonator having a weight for adjusting the temperature characteristics deposited on at least one of both ends of the NS-GT cut quartz resonator in the longitudinal direction, the method comprising the steps of: forming a resonator having a characteristic that the first order temperature coefficient of the resonator is shifted from a desired value in advance; and adjusting a normalized frequency in accordance with a relationship between the normalized frequency and the first order temperature coefficient to adjust the first order temperature coefficient to zero.

There exists a given relationship between the normalized frequency and the first order temperature coefficient. Therefore, this normalized frequency is adjusted in such a manner that the first order temperature coefficient is adjusted to substantially zero. As a result, an NS-GT cut quartz resonator with remarkably excellent temperature characteristics can be obtained.

BRIEF DESCRIPTION OF THE DRAWINGS

FIG. 1 shows one example of electrodes and the configuration of an NS-GT, cut resonator which are applied to the present invention, in which

FIG. 6 shows five samples of the frequency-to-temperature characteristics of an NS-GT cut resonator formed by the etching method.

FIG. 8 shows steps of forming the resonator and adjusting the normalized frequency of the resonator in accordance with the method of the present invention.

DETAILED DESCRIPTION OF THE PREFERRED EMBODIMENT

Now, an embodiment of the present invention will be concretely described.

Figure 1A:
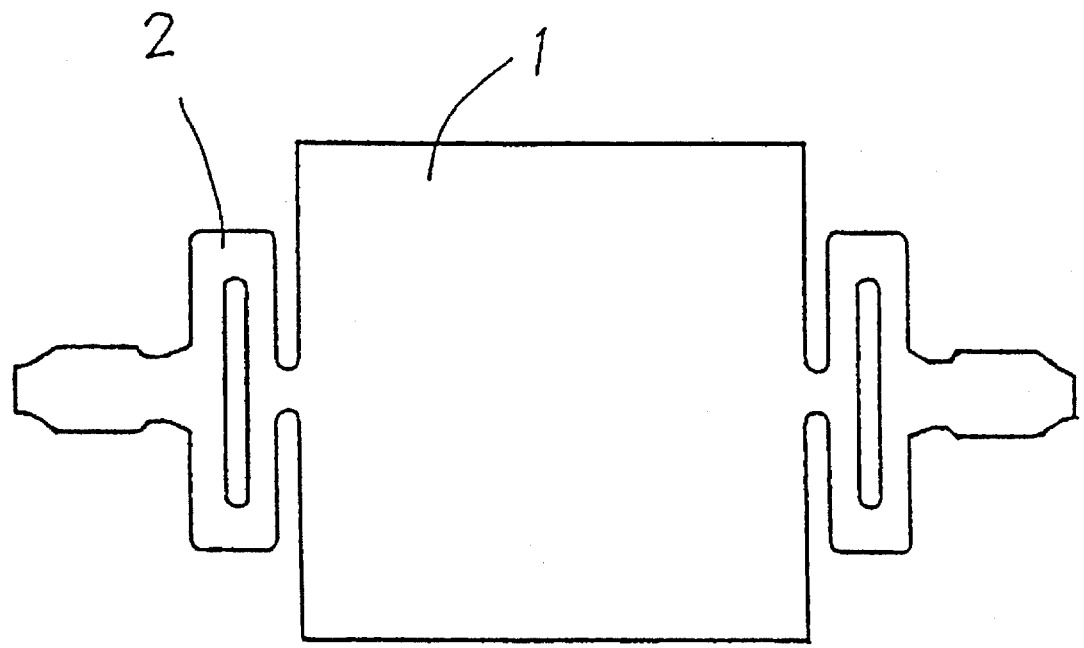
FIG. 1A is a front view thereof and FIG. 1B is a top view thereof.
Figure 1B:
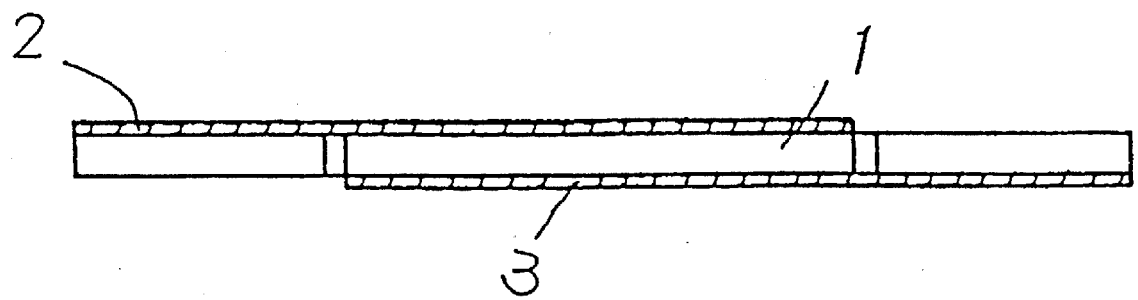

FIG. 1 shows one example of electrodes and the configuration of an NS-GT cut resonator, which are applied to the present invention. FIG. 1(A) shows a front view thereof whereas FIG. 1(B) shows a top view thereof. On the obverse and reverse sides of a vibrational portion of a quartz 1, electrodes 2 and 3 are disposed, respectively, and the resonator can be easily excited by applying an alternating voltage between the electrodes.

Figure 2:
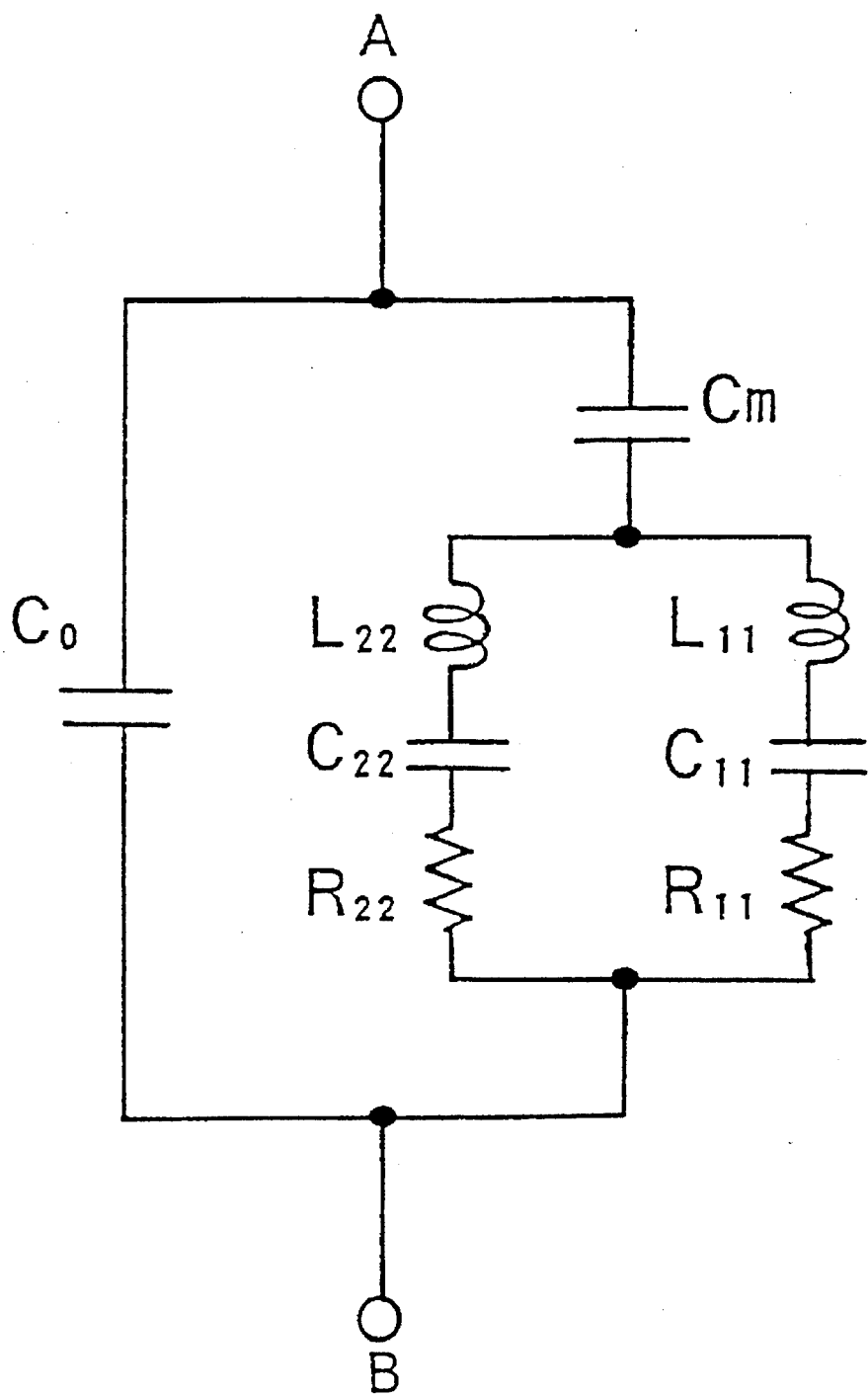
FIG. 2 shows an electrical equivalent circuit of the NS-GT cut resonator applied to the present invention.

FIG. 2 shows an electrical equivalent circuit of the NS-GT cut resonator which is applied to the present invention. The circuit includes a series arm ($L_{11}$, $C_{11}$, $R_{11}$) of a primary vibration, a series arm ($L_{22}$, $C_{22}$, $R_{22}$) of a subvibration, a coupling capacitance Cm and a parallel capacitance Co. Therefore, the resonant frequency of the NS-GT cut resonator which couples two vibration modes with each other is obtained from this equivalent circuit. Hereinafter, the resonant frequency will be described in detail together with the principle of adjusting the temperature characteristics.

The electrical equivalent circuit shown in FIG. 2 can be represented by an impedance Z. That is, it is represented by the sum of a real part Rei (i=1, 2) and an imaginary part jxe. Since the mechanical loss resistances $R_{11}$ and $R_{22}$ of the quartz resonator are very small, when $R_{11} \approx R_{22} \approx 0$, then Xe is represented as follows:

EX. 1

$$Xe = \frac{-1\left[\left(\frac{f^2}{f_1^2}-1\right)\left(\frac{f^2}{f_2^2}-1\right)-\frac{C_1C_2}{Cm^2}\right]}{2\pi f C_0 \left[\left(\frac{f^2}{f_1^2}-1\right)\left(\frac{f^2}{f_2^2}-1\right)-\frac{C_1C_2}{Cm^2}-\left(\frac{C_2}{C_0}\left(\frac{f^2}{f_1^2}-1+\frac{C_1}{Cm}\right)+\frac{C_1}{C_0}\left(\frac{f^2}{f_1^2}-1+\frac{C_2}{C_0}\right)\right)\right]}$$

where $f_1$ and $f_2$ are uncoupled resonant frequencies of the primary vibration and the subvibration, respectively.

EX. 2

$$\frac{1}{C_1} = \frac{1}{C_{11}} + \frac{1}{C_m}, \quad \frac{1}{C_2} = \frac{1}{C_{22}} + \frac{1}{C_m}$$

Therefore, if the coupled resonant frequencies of the primary vibration and the subvibration are taken as $f_+$ and $f_-$, respectively, the following relation is obtained from the expression (EX. 1):

EX. 3

$$f_1^2 + f_2^2 = f_+^2 + f_-^2$$

$$(1-k^2m)f_1^2 f_2^2 = f_+^2 f_-^2$$

which can be written as $$K^2 m = -[[(f_+^2 f_-^2)/(f_1^2 f_2^2)] - 1]$$

where $K^2 m = C_1 C_2 / C^2 m$ is given, and Km is called a coupling coefficient. The expression (EX. 3) is differentiated by a temperature t once and $\cdot = \partial/\partial t$ is taken. Then the first order temperature coefficients $\alpha_1$ and $\alpha_2$ of the uncoupled primary vibration and subvibration, the first order temperature coefficients $\alpha_+$ and $\alpha_-$ of the coupled primary vibration and subvibration, the first order temperature coefficient $\alpha_{km}$ of the coupling coefficient, and K which is given as a function of the coupling coefficient Km are taken. These coefficients are given as follows:

EX. 4

$$\alpha_1 = \dot{f}_1 / f_1$$

$$\alpha_2 = \dot{f}_2 / f_2$$

$$\alpha_+ = \dot{f}_+ / f_+,$$

$$\alpha_- = \dot{f}_- / f_-$$

$$\alpha_{km} = \dot{K}m / Km,$$

$$K = K^2 m / (1 - K^2 m)$$

The following significant relationship is obtained from the expressions (EX. 3) and (EX. 4). That is, $$\alpha_+ + \alpha_- = \alpha_1 + \alpha_2 - K\alpha_{km} \quad (5)$$

The sum of $\alpha_+$ and $\alpha_-$ becomes a constant value. When a frequency ratio $f_{MP}$ and R are newly applied and $f_{MP} = f_-/f_+$ and $R = f_2/f_-$ are given, $\alpha_+$ of the expression (EX. 5) is rewritten as follows:

$$\alpha_+ = \frac{\alpha_1 - \alpha_2 f_{MP}^2}{1 - f_{MP}^2} + \frac{f_{MP}^2}{1 - f_{MP}^2} \{K\alpha_{km} - R^2(\alpha_1 - \alpha_2)\}$$

A normalized frequency $\delta$ is newly defined as follows:

EX. 6

$$\delta = \frac{f_{MP}^2}{1 - f_{MP}^2}$$

Therefore, the expression (EX. 6) is represented as follows:

EX. 7

$$\alpha_+ = m\delta + n$$

where $$m = K\alpha_{KM} - R^2(\alpha_1 - \alpha_2)$$

$$n = (\alpha_1 - \alpha_2 f_{MP}^2)/(1 - f_{MP}^2)$$

and m and n have the respective given values while the frequency ratio $f_{MP}$ is changed a little. Consequently, when an inclination m is determined, $f_{MP}$ when $\alpha_+ = 0$ can be easily calculated from the equation (EX. 7). As will be described later, m is calculated through the experiment. Hereinafter, the method of adjusting the temperature coefficient will be described on the basis of the adjustment principle.

Figure 3:
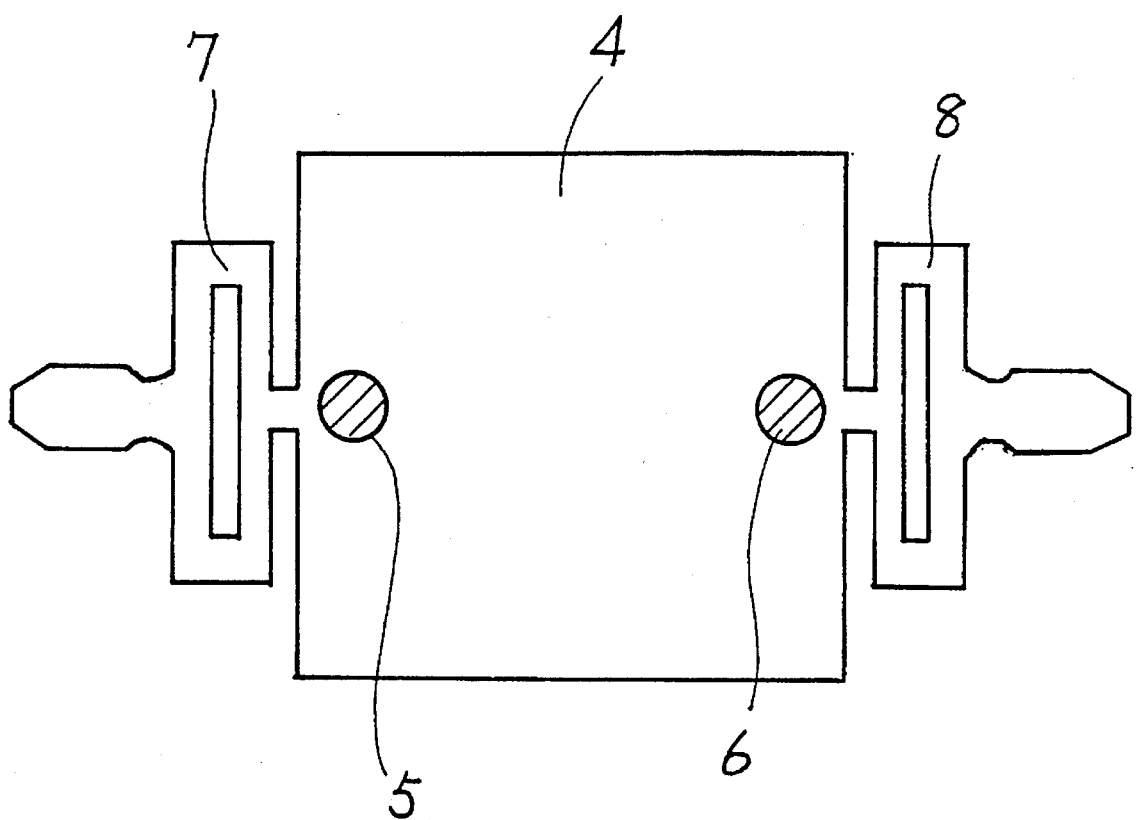
FIG. 3 shows the NS-GT cut resonator of the present invention, showing the position of weights adhered to the resonator for adjusting the first order temperature coefficient $\alpha_+$.

FIG. 3 shows the NS-GT cut resonator 4 of the present invention and the respective positions of weights 5 and 6 adhered to the resonator 4 by an evaporation method to adjust $\alpha_+$, which is applied to the present invention. The weights 5 and 6 are deposited on both ends of the resonator with supporting portions 7 and 8 in the longitudinal direction. Of course, only one weight may be deposited on one position. The coupled resonant frequency $f_-$ of the subvibration can be remarkably changed by adding the weights 5 and 6 at those positions. In this embodiment, these weights are located in the center of the resonator in the widthwise direction. In another embodiment (not shown) four weights are employed along the width of the resonator 1 at positions shifted from the center thereof in which the same effect as with the first embodiment is achieved.

Figure 4:
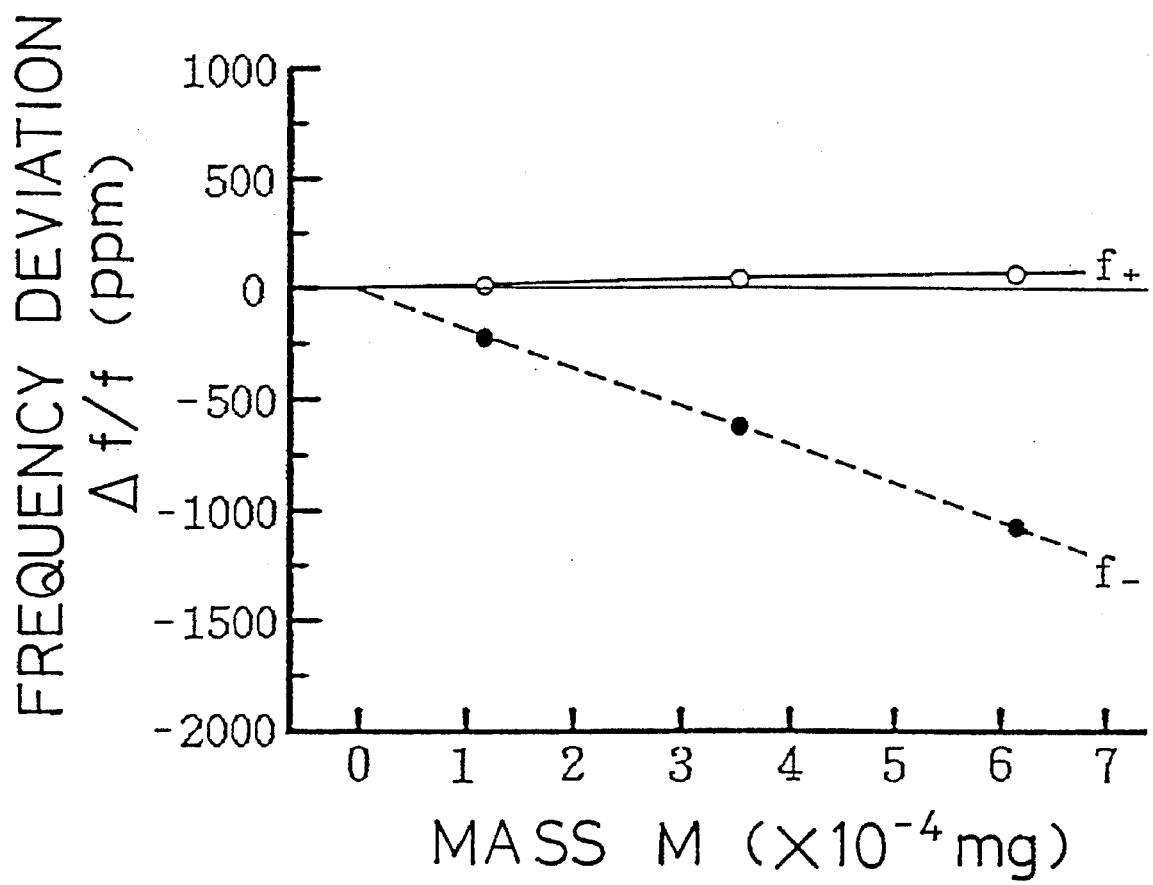
FIG. 4 shows a change in the resonant frequencies of the primary vibration and the subvibration versus the weight quantity.

FIG. 4 shows the change of a frequency relative to the quantity of the weights 5 and 6 which have been added. As is apparent from FIG. 4, it has been found that $f_-$ is largely changed while $f_+$ is almost stable. It means that the coupling state between the primary vibration and the subvibration is changed according to the weights 5 and 6 with this relationship. In other words, $\alpha_+$ can be adjusted.

Figure 5:
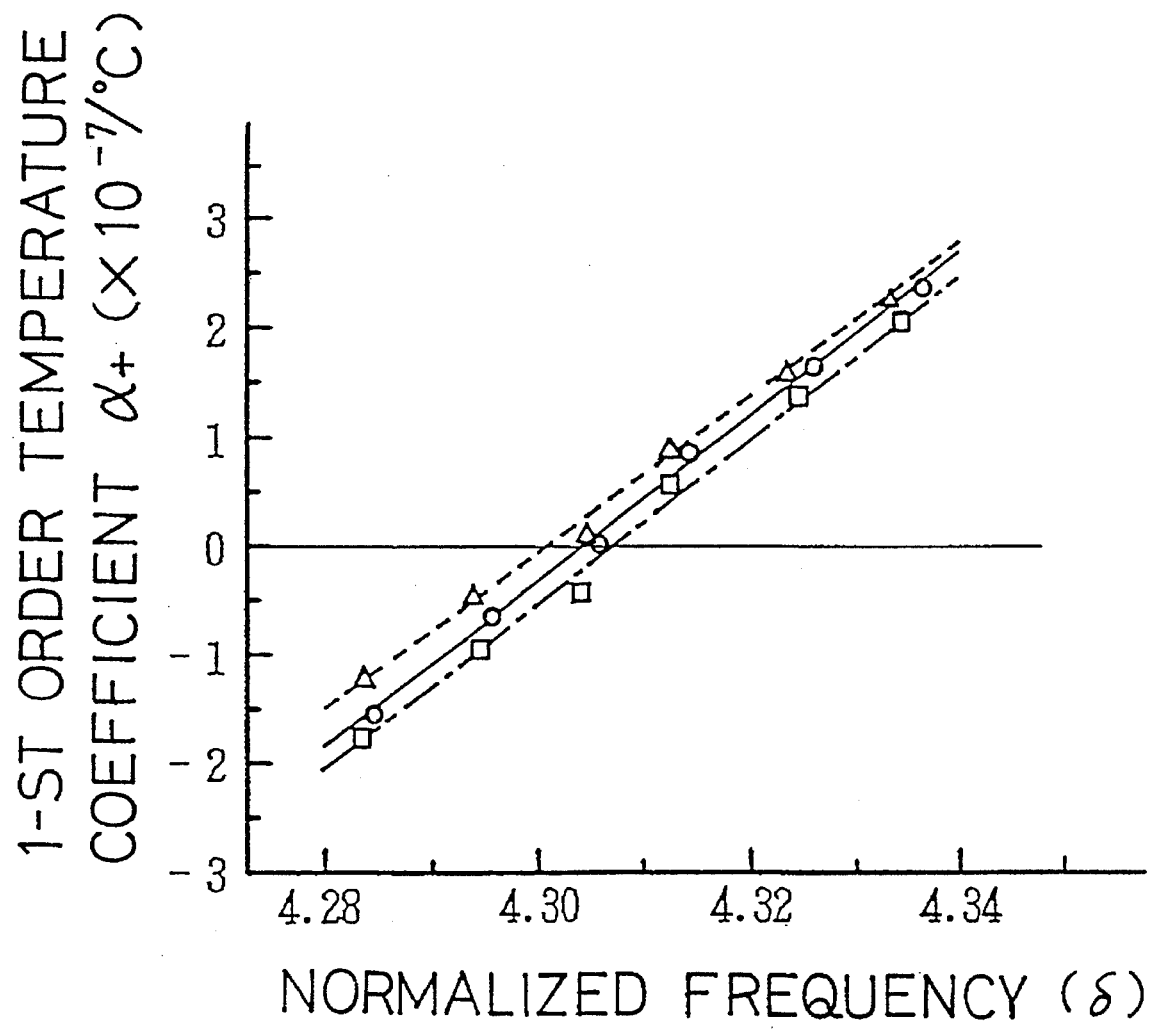
FIG. 5 shows a relationship between a normalized frequency $\delta$ and the first order temperature coefficient $\alpha_+$.

FIG. 5 shows a relationship between the normalized frequency δ and the first order temperature coefficient $\alpha_+$ of the primary vibration when the primary and subvibrations are coupled with each other. As was described in the explanation of the adjustment principle, $\alpha_+$ and δ are proportional, and its inclination m has a substantially given value. For example, in the case where the frequency f of this resonator is 2.1 MHz, m is $75\times10^{-7}/°C$. The adjustment results are indicated below.

FIG. 6 shows five samples of the frequency-to-temperature characteristics of the NS-GT cut resonator which has been formed by the etching method. The resonator previously having the shift characteristic is provided so that the frequency change becomes within ±20 ppm in the wide range of a temperature of −30° to +85 °C., and also $\alpha_+$ is a positive value. In general, the value of $\alpha_+$ is set to 1 to 3× $10^{-7}/°C$. On the other hand, the absolute values of the second and third order temperature coefficients $\beta_+$ and $\gamma_+$ at this case become smaller than $5\times10^{-10}/°C$ and $6\times10^{-13}/°C^3$, respectively. Therefore by setting $\alpha_+$ to approximately zero, an NS-GT cut resonator with excellent temperature characteristics is obtained.

Figure 7:
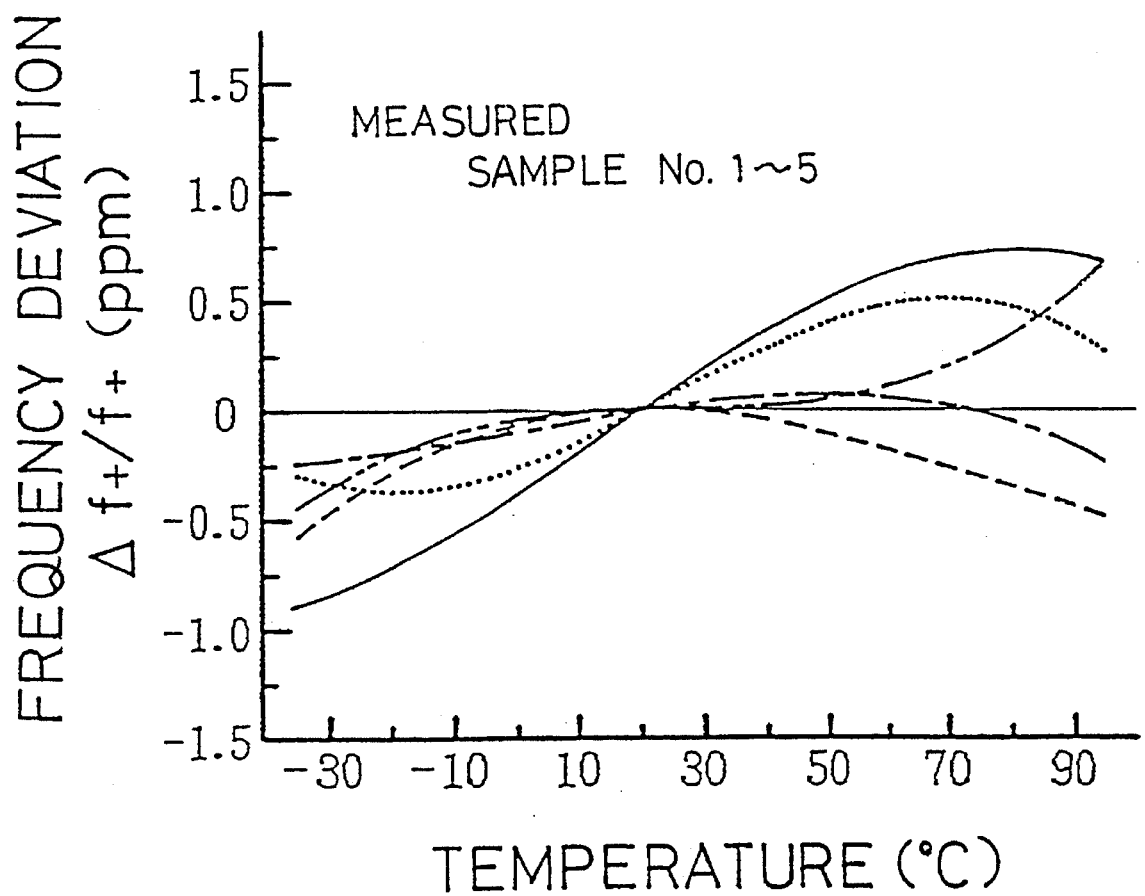
FIG. 7 shows five samples of the frequency-to-temperature characteristics which have been adjusted in accordance with the method of the present invention.

FIG. 7 shows five samples of the frequency-to-temperature characteristics when the first order temperature coefficient $\alpha_+$ is adjusted to approximately zero according to the method of the invention. The NS-GT cut resonator with extremely excellent temperature characteristics can be obtained, so that the frequency change is within ±1.0 ppm in the wide temperature range of −30° to 85° C.

FIG. 8 shows the steps of forming the resonator and adjusting the normalized frequency of the resonator according to the relationship between the normalized frequency and the first order temperature coefficient to adjust the first order temperature coefficient substantially to zero. In FIG. 8, step 101 includes forming the vibrational portion and supporting portions of vibration of the present invention, step 102 includes forming an electrode, step 103 includes depositing weight on the vibrator and step 104 includes measuring temperature characteristics.

As was described above, the present invention discloses a method of adjusting the temperature coefficient, which has the following remarkable advantages:

(1) Since the first order temperature coefficient $\alpha_+$ and the normalized frequency δ are in proportional relationship, a δ which gives $\alpha_+=0$ can be easily calculated and the NS-GT cut resonator having remarkably excellent temperature characteristics is obtained by adjusting δ:

(2) Since the normalized frequency δ can be very simply adjusted, the resonator is obtained inexpensively:

(3) Since the adjustment by an evaporation method does not cause damage to the resonator, the resonator with a reduced mechanical loss resistance and a high Q value is obtained. Simultaneously, a resonator with excellent aging characteristics is obtained.

What is claimed is:

1. A method of adjusting a frequency-to-temperature coefficient of a coupling resonator comprising the steps of: providing an NS-GT cut quartz coupling resonator having a first order temperature coefficient $\alpha_+$ and a vibrational portion vibratable in at least two coupled together modes of vibration including a primary vibrational mode and a subvibrational mode; calculating a normalized frequency δ of the coupled vibrational modes according to the relationship $\alpha_+=m\delta+n$, where m is a constant defined by the relationship $m=K\alpha_{Km}-R^2(\alpha_1-\alpha_2)$ where K is given as a function of a coupling coefficient Km where $K^2m$ is defined by $K^2m=-[[(f_1^2f_-^2)/(f_1^2f_2^2)]-1]$, $\alpha_{Km}$ is the first order temperature coefficient of the coupling coefficient Km, $R=f_2/f_-$, $f_1$ is the resonant frequency of the uncoupled primary vibrational mode, $f_2$ is the resonant frequency of the uncoupled subvibrational mode, $f_1$ is the resonant frequency of the coupled primary vibrational mode, $f_-$ is the resonant frequency of the coupled subvibrational mode, $\alpha_1$ is the first order temperature coefficient of the uncoupled primary vibrational mode and $\alpha_2$ is the first order temperature coefficient of the uncoupled subvibrational mode, and where n is a constant defined by the relationship $n=(\alpha_1-\alpha_2f_{MP}^2)/(1-f_{MP}^2)$, where $f_{MP}=f_-/f_+$; and adding weights to or removing weights from the vibrational portion of the resonator at a predetermined position thereof so as to adjust the normalized frequency δ of the coupled vibrational modes to set the first order temperature coefficient $\alpha_+$ to substantially zero.

2. A method of adjusting a frequency-to-temperature coefficient of a resonator according to claim 1; wherein the predetermined position comprises the vicinity of the center in the width direction of the vibrational portion of the resonator.

* * * * *